(12) United States Patent
Jacobus

(10) Patent No.: US 9,384,107 B2
(45) Date of Patent: Jul. 5, 2016

(54) IMPROPER VOLTAGE LEVEL DETECTION IN EMULATION SYSTEMS

(75) Inventor: William E. Jacobus, Woodbury, MN (US)

(73) Assignee: Mentor Graphics Corporation, Wilsonville, OR (US)

( * ) Notice: Subject to any disclaimer, the term of this patent is extended or adjusted under 35 U.S.C. 154(b) by 310 days.

(21) Appl. No.: 13/292,027

(22) Filed: Nov. 8, 2011

(65) Prior Publication Data

US 2012/0203533 A1    Aug. 9, 2012

Related U.S. Application Data

(60) Provisional application No. 61/411,305, filed on Nov. 8, 2010.

(51) Int. Cl.
| | |
|---|---|
| *G06F 11/26* | (2006.01) |
| *G06F 11/36* | (2006.01) |
| *G01R 19/165* | (2006.01) |
| *G01R 31/316* | (2006.01) |
| *G01R 31/302* | (2006.01) |
| *G01R 31/30* | (2006.01) |
| *G01R 31/317* | (2006.01) |
| *G01R 31/3167* | (2006.01) |
| *G01R 19/00* | (2006.01) |
| *G01R 31/28* | (2006.01) |

(52) U.S. Cl.
CPC ............ *G06F 11/261* (2013.01); *G01R 19/165* (2013.01); *G06F 11/3652* (2013.01); *G01R 19/0038* (2013.01); *G01R 31/2851* (2013.01); *G01R 31/30* (2013.01); *G01R 31/302* (2013.01); *G01R 31/316* (2013.01); *G01R 31/317* (2013.01); *G01R 31/3167* (2013.01)

(58) Field of Classification Search
None
See application file for complete search history.

(56) References Cited

U.S. PATENT DOCUMENTS

| | | | | |
|---|---|---|---|---|
| 4,144,481 | A | * | 3/1979 | Clarke ................. H02P 7/2885 318/457 |
| 5,336,948 | A | * | 8/1994 | Jordan ........................... 326/22 |
| 5,649,210 | A | * | 7/1997 | Allen ............................ 713/320 |
| 5,748,875 | A | * | 5/1998 | Tzori ............................. 714/29 |
| 5,963,736 | A | * | 10/1999 | Sarno et al. ..................... 703/27 |
| 2003/0141894 | A1 | * | 7/2003 | Gonzalez ....................... 326/26 |
| 2003/0225560 | A1 | * | 12/2003 | Garcia et al. ................... 703/17 |
| 2004/0046604 | A1 | * | 3/2004 | Kim ............................... 327/536 |
| 2004/0148153 | A1 | * | 7/2004 | Beletsky et al. ................. 703/27 |
| 2006/0129374 | A1 | * | 6/2006 | Larson et al. .................... 703/25 |
| 2007/0088514 | A1 | * | 4/2007 | Waschura et al. ............... 702/65 |

(Continued)

OTHER PUBLICATIONS

Nilsson, James W., "Electric Circuits", 1983, Addison-Wesley, Reading Massachusetts, pp. 42-43.*
"Users Guide vol. 2, Measurement and Analysis, Agilent 4155B Semiconductor Parameter Analyzer, Agilent 4156B Precision Semiconductor Parameter Analyzer," Agilent part No. 04156-90200, May 2000, 416 pages.*

(Continued)

*Primary Examiner* — Aniss Chad
*Assistant Examiner* — David M Rogers
(74) *Attorney, Agent, or Firm* — Klarquist Sparkman, LLP

(57) ABSTRACT

Method and apparatus for detecting an improper voltage levels between a hardware emulator and an auxiliary hardware device are provided. In various implementations, a voltage level detector is attached to a bus that connects an emulator with an auxiliary hardware device. Subsequently, the voltage level detector can be used to detect when operating conditions on the bus are outside specification. More specifically, when the voltage level on the bus falls outside a threshold level, the voltage level detector may be used to alert a user, pause operation of the emulator or both.

14 Claims, 8 Drawing Sheets

(56) References Cited

U.S. PATENT DOCUMENTS

2010/0109426 A1* 5/2010 Fugiel et al. .................. 303/3
2010/0145672 A1* 6/2010 Yen ........................ G06F 1/28
                                                     703/28

OTHER PUBLICATIONS

"Veloce Product Family", Mentor Graphics Corporation, Via Wayback Machine, Apr. 23, 2009, 2 pages.*

* cited by examiner

IMPROPER VOLTAGE LEVEL DETECTION IN EMULATION SYSTEMS

REFERENCE TO RELATED APPLICATIONS

This application claims priority under 35 U.S.C. §119 to U.S. Provisional Patent Application No. 61/411,305, filed Nov. 8, 2010, entitled "Hardware Emulation Apparatus to Detect Improper Signal Voltage Levels" and naming William Jacobus as inventor, which application is incorporated entirely herein by reference.

FIELD OF THE INVENTION

The present invention is directed towards emulation systems. Particularly, the present invention is directed towards detecting improper voltage levels on signal lines within an emulation apparatus.

BACKGROUND OF THE INVENTION

Electronic circuits, such as integrated circuits, are used in a variety of products, from automobiles to microwave ovens to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators, and errors in the design are corrected.

Several steps are common to most design flows. Typically, the specification for the new circuit initially is described at a very abstract level as a logical design. An example of this type of abstract description is a register transfer level (RTL) description of the circuit. With this type of description, the circuit is defined in terms of both the exchange of signals between hardware registers and the logical operations that are performed on those signals. A register transfer level design typically employs a Hardware Design Language (HDL), such as the Very high speed integrated circuit Hardware Design Language (VHDL) or the Verilog language. The logic of the circuit is then analyzed, to confirm that the logic incorporated into the design will accurately perform the functions desired for the circuit. This analysis is sometimes referred to as "functional verification."

In some instances, the functionality of the circuit design will be verified by simulating the operation of the design using software. Some designs may be too large or complex to efficiently simulate using software, however. Instead, the functionality of the circuit design will verified by emulating the circuit design using a hardware emulator. Examples of hardware emulators include, for example, the VELOCE family of emulators available from Mentor Graphics Corporation of Wilsonville, Oreg., the ZEBU family of emulators available from EVE SA of Palaiseau, France, and the PALLADIUM family of emulators available from Cadence Design Systems of San Jose, Calif. An emulator typically will provide a set of primitive components for emulating the operation of a circuit design. For example, emulators, some of which may use conventional field-programmable gate array circuits, emulate the functionality of a circuit design using a combination of state elements, memories and lookup tables. Of course, other types of emulators may provide additional or alternate primitive components. For example, alternatively, an emulator may function by using combinatorial elements computing a selectable function over a fixed number of inputs.

As those of ordinary skill in the art will appreciate, emulators are often connected to auxiliary hardware devices, such that during emulation, behavior of the design being emulated and the auxiliary hardware device can be tested. As will be appreciated, this connection is typically facilitated through a bus. As such, conflicts between the emulator and the auxiliary hardware device can arise during emulation, for example, due to bus drivers with incorrect timing. Additionally, when the emulator and the auxiliary hardware device operate on different voltages, a voltage level translator needs to be inserted into the bus, in order to facilitate operability. Conflicts arising from the voltage level translator not operating as expected can also arise during emulation. Furthermore, various auxiliary devices require a period of time in which to warm up prior to operation. If this warm up time is not properly accounted for in the emulation, then conflicts can also arise due to the auxiliary device not being warmed up.

BRIEF SUMMARY OF THE INVENTION

Aspects of the invention are applicable to detecting improper voltage levels on signals lines connecting an emulator to an auxiliary hardware device.

In various implementations, a voltage level detector is attached to a bus that connects an emulator with an auxiliary hardware device. Subsequently, the voltage level detector can be used to detect when operating conditions on the bus are outside specification. More specifically, when the voltage level on the bus falls outside a threshold level, the voltage level detector may be used to alert a user, pause operation of the emulator or both.

With various implementations, the voltage level detector will be formed by connecting two operational amplifiers in parallel with variable resistors connecting the operational amplifiers to power and the bus being sampled into the operational amplifier circuit. The output of the operational amplifiers could be used to determine the voltage level on the bus.

These and additional implementations of invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are often high-level abstractions of the actual operations that are performed. The actual operations that correspond to these terms will often vary depending on the particular implementation.

Some of the methods described herein can be implemented by software stored on a computer readable storage medium, or executed on a computer. Accordingly, some of the disclosed methods may be implemented as part of a computer implemented electronic design automation ("EDA") tool. The selected methods could be executed on a single computer or a computer networked with another computer or computers.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
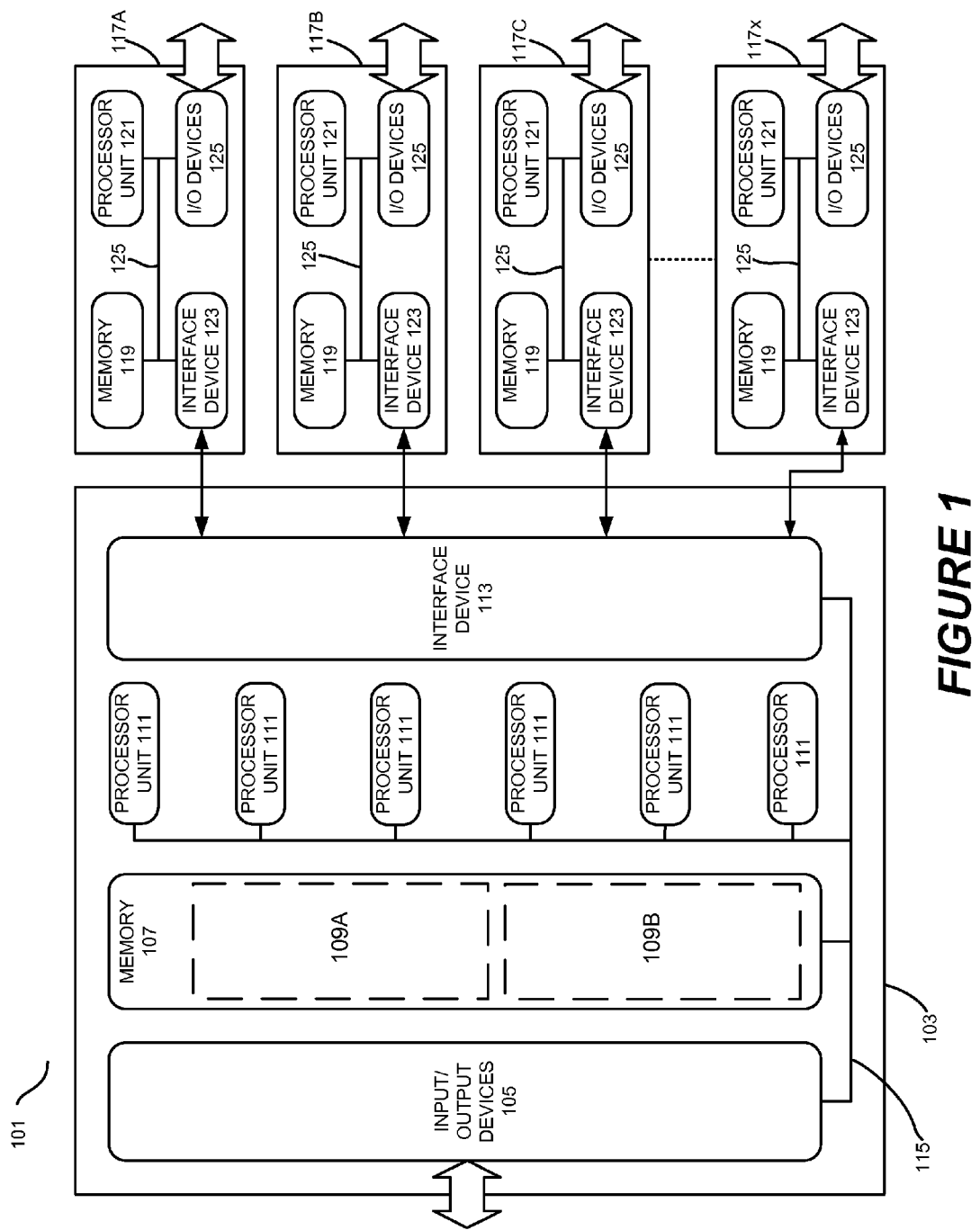
FIGS. 1 and 2 illustrate an example of a computing environment that may be employed to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. As those of skill in the art will appreciate, computer-readable storage media are inherently non-transitory in nature. More specifically, the data stored on the media may be recalled at a later time, as opposed, to being a transitory communication where the data must be received by a communication device before the transitory signal becomes unavailable.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as INTEL® PENTIUM® or XEON™ microprocessors, ADVANCED MICRO DEVICES ATHLON™ microprocessors or MOTOROLA 68K/COLDFIRE® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
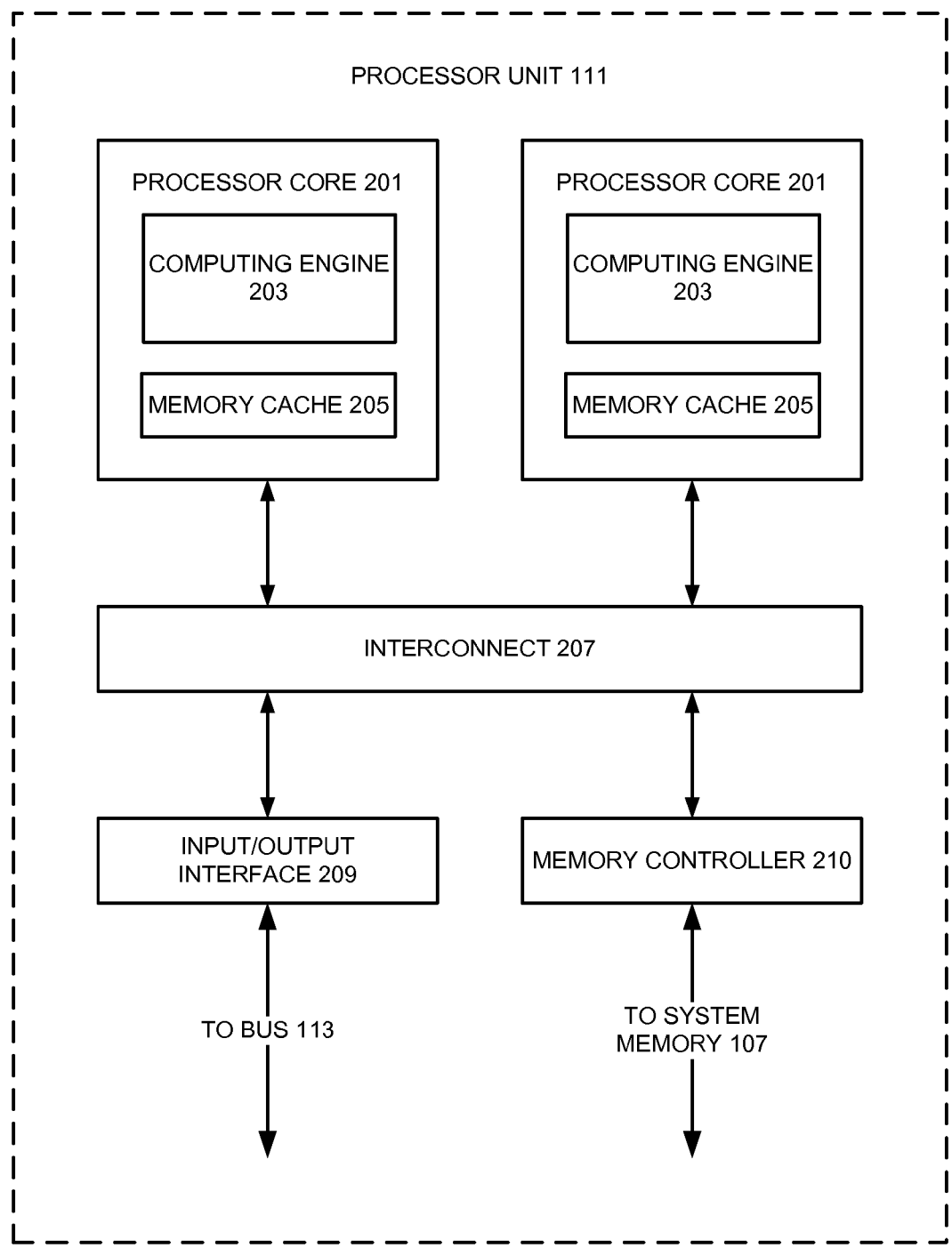

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the OPTERON™ and ATHLON™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as INTEL® PENTIUM® or XEON™ microprocessors, ADVANCED MICRO DEVICES ATHLON™ microprocessors or MOTOROLA 68K/COLDFIRE® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it is not intended to suggest any limitation as to the scope of use or functionality of alternate embodiments of the invention.

Illustrative Emulation Environment

As stated above, various implementations of the invention provide a protocol proxy for a hardware emulator. As such, the concept of hardware emulation and an illustrative emulation environment 301 are discussed herein in relation to FIGS. 3A, 3B and 3C. As can be seen from these figures, the emulation environment 301 includes an emulator 303 and a control workstation 305. The emulator 303 includes a plurality of configurable logic blocks 307, a configurable interconnect 309, a memory 311, and a communication interface 313.

As those of skill in the art will appreciate, a number of different technologies exist for implementing the emulator 303. For example, the configurable logic blocks 307 may be field-programmable gate arrays (FPGAs). Alternatively, the configurable logic blocks 307 may be implemented using look-up tables. Similarly, in some implementations the configurable interconnect 311 may a cross-bar device, while in alternative implementations the configurable interconnect may be a multiplexer.

In order to emulate an electronic design, such as, for example, the design for an integrated circuit, the design is first taken and compiled into another design. This compiled design is then used by the control workstation 305 to program the configurable logic blocks 307 and the configurable interconnect 309 to imitate or mimic the behavior of the electronic design. The electronic design is often referred to as the "design under test." As can be seen from FIG. 3B, the emulator 303 shows a design under test 315 as being "loaded" onto the emulator 303. Subsequently, the behavior of the design under test 315 can be emulated by causing the emulator 303 to run.

The communication interface 313 and the memory 311 are often provided to facilitate programming the emulator 303, and providing various debugging features that enable an engineer to verify the functionality of the design under test 315. For example, in some implementations, state information of the various components of the design under test 315 during execution may be recorded by the emulator 303 in the memory 311. Furthermore, commands and responses can be passed to the control workstation 305 via the communication interface 313. For example data stored in the memory 311 may be passed to the control workstation 305.

Furthermore, as those of ordinary skill in the art will appreciate, it is often desirable to emulate the behavior of a design under test 315 while the design is connected to an auxiliary hardware device 317 via a bus 319. In some implementations, the auxiliary hardware device may be a Universal Serial Bus (USB) device, such as, for example, a USB flash memory storage device, or a USB microphone. With alternative implementations, the auxiliary hardware device may be an embedded multi-media card (eMMC). Various implementations of the invention may use any number of technologies to implement the bus 319, such as, for example, the USB standard mentioned above. Other examples of possible bus technologies are the Joint Test Action Group (JTAG) standard and the Inter-Integrated Circuit (I2C) standard.

As those of skill in the art will appreciate a number of different technologies and techniques for implementing an emulator are known in the art. The discussion above is provided as an example only, and is not intended to be limiting.

Illustrative Improper Voltage Level Detector

Figure 3A:
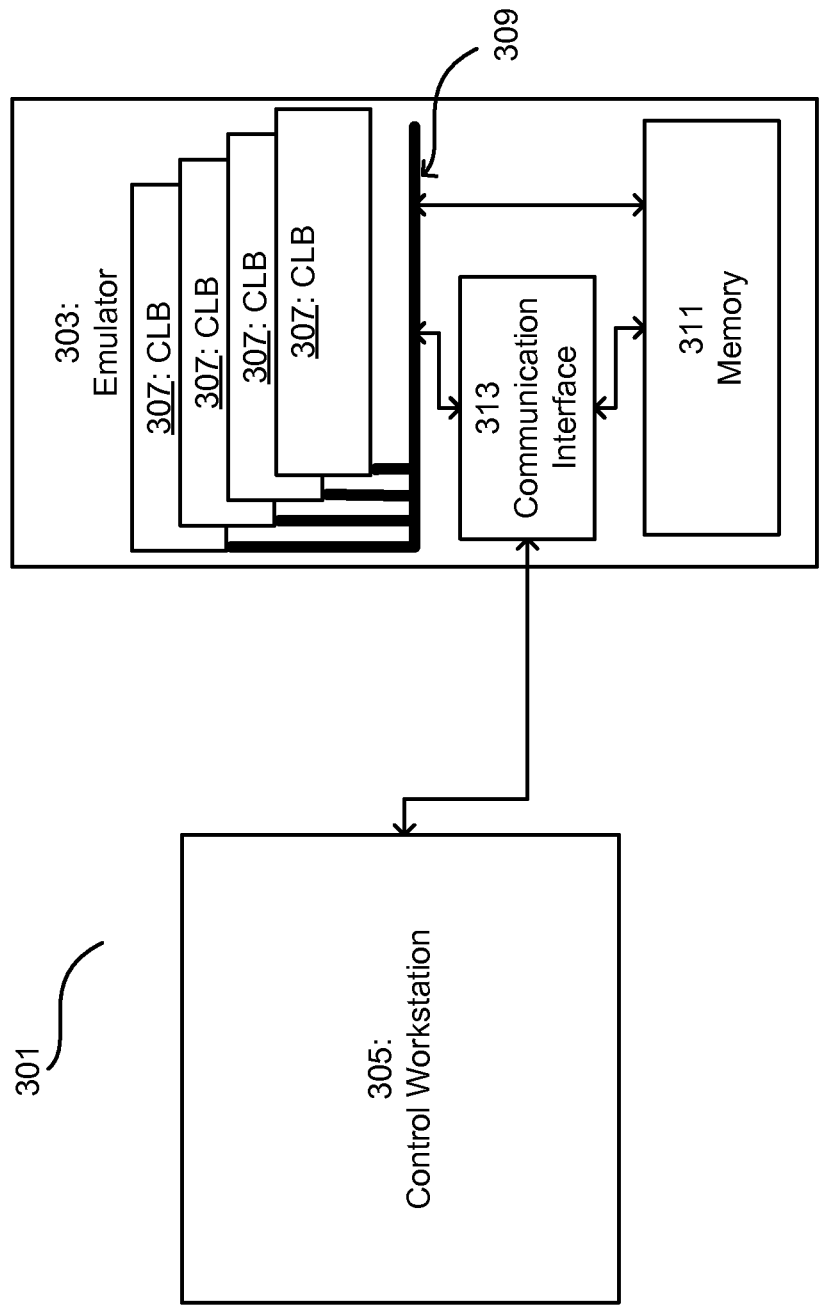
FIGS. 3A, 3B and 3C illustrate an emulation environment.
Figure 3B:
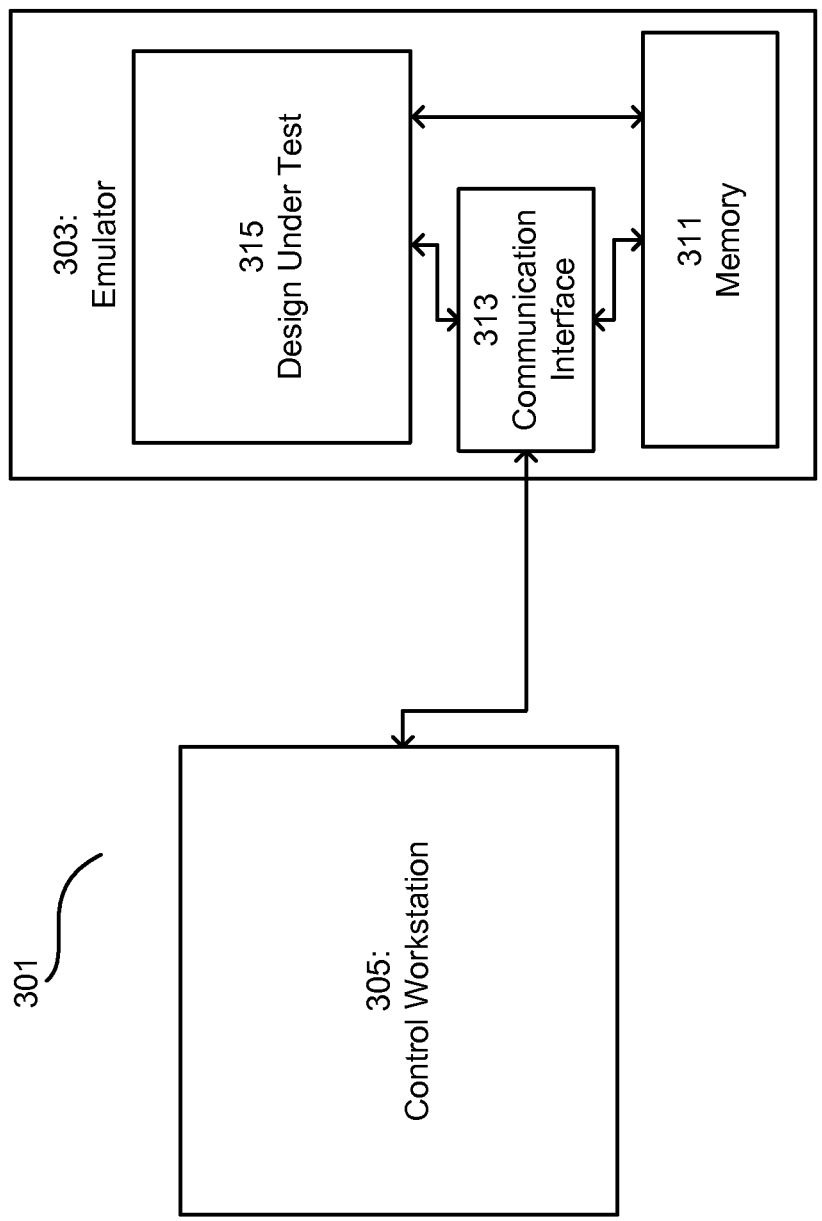
Figure 3C:
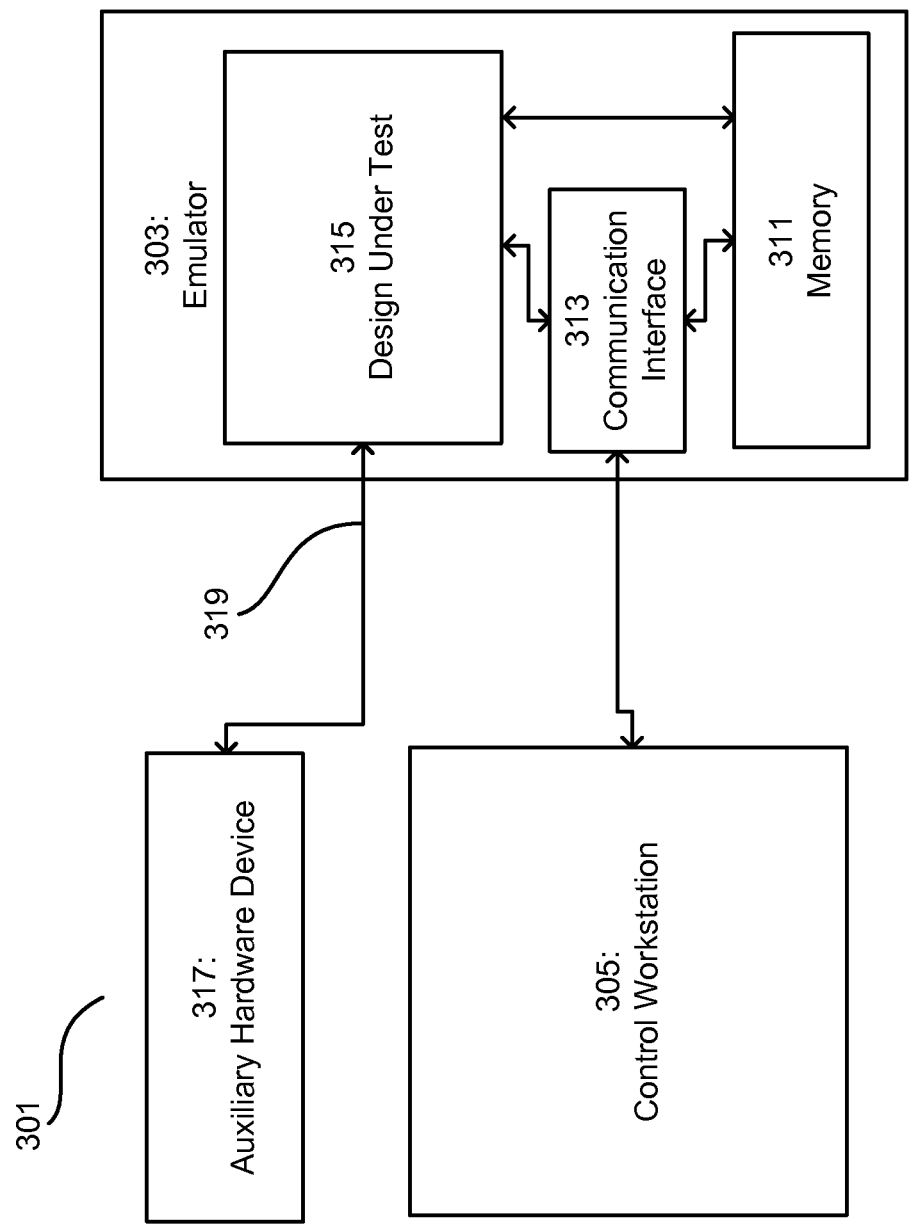
Figure 4:
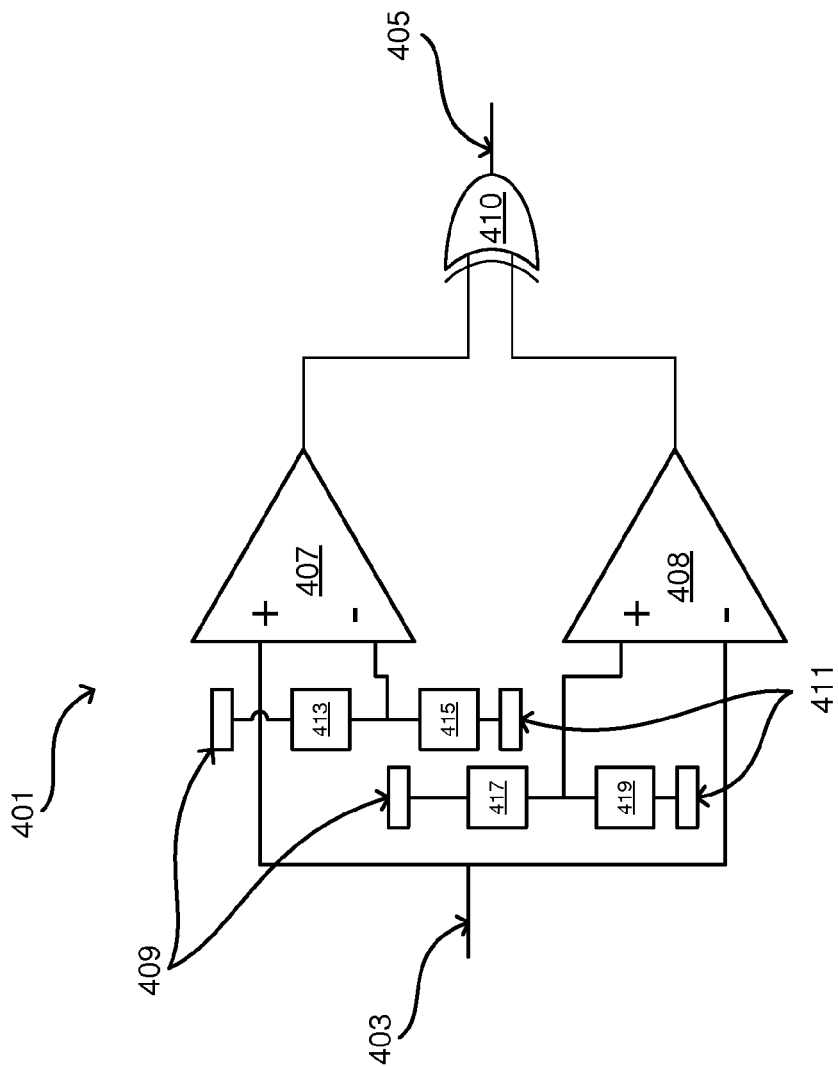
FIG. 4 illustrates an improper voltage level detector.

FIG. 4 illustrates a voltage level detector circuit 401, which may be attached to the emulator 301 of FIGS. 3A-3C to implement various embodiments of the present invention. As can be seen from FIG. 4, the circuit 401 has an input port 403 and an output port 405. The input port is connected to a non-inverting input of an operational amplifier 407 and an inverting input of an operational amplifier 408. An inverting input of the operational amplifier 407 is connected to an output of a set of resistors formed by resistors 413 and 415. A non-inverting input of the operational amplifier 408 is connected to an output of a set of resistors formed by resistors 417 and 419. The sets of resistors are connected to power 409 and ground 411 as illustrated. Each output of the operational amplifiers 407 and 408 is connected to respective inputs of an exclusive-or gate 410. An output of the exclusive-or gate 410 is connected to the output port 405. With various implementations, the input 403 will be connected to the bus 319 in the emulator 301 of FIG. 3C. More specifically, the bus that connects the emulator to an auxiliary hardware device will be sampled and input into the circuit 401. The resistors 413 through 419, which in some implementations, may be variable, can be adjusted to detect different voltage conditions on the bus 319. If the voltage on the bus 319 falls outside a threshold value, as specified by the configuration of the resistors 413 through 419, the output 405 will change state.

Figure 5:
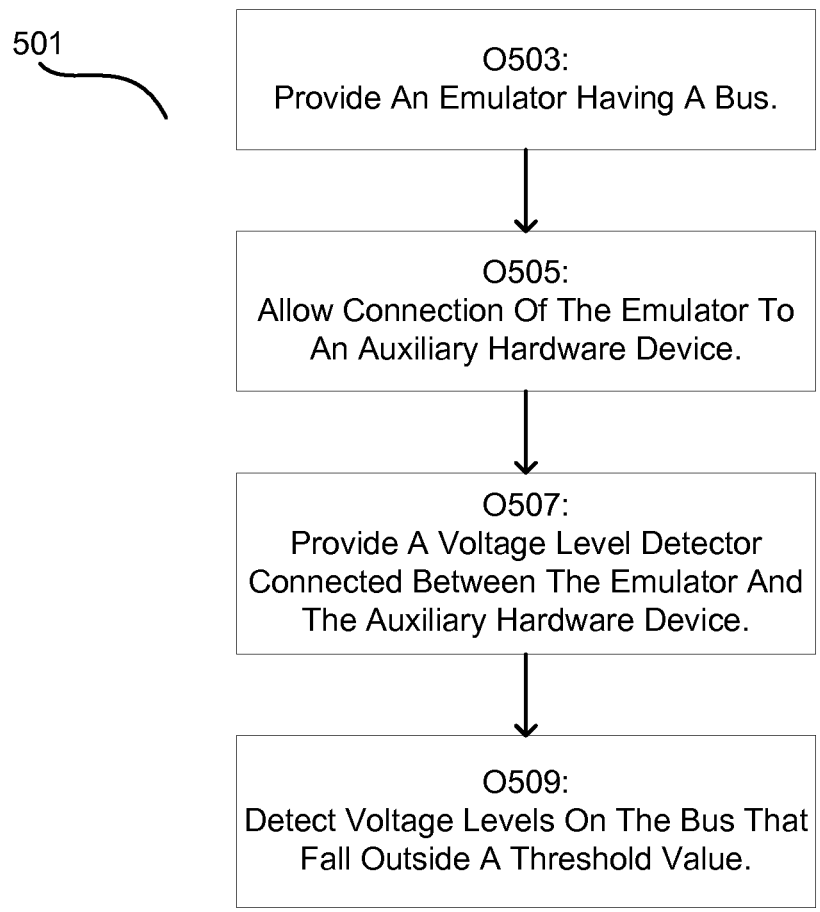
FIG. 5 illustrates a method of detecting improper voltage levels in an emulation environment.

FIG. 5 illustrates a method 501 that may be implemented by various embodiments of the present invention to detect an improper voltage level within an emulation environment. As can be seen from this figure, the method 501 includes an operation 503 for providing an emulator having a bus for connection to an auxiliary hardware device. As detailed above in conjunction with FIGS. 3A-3C, an emulator may be connected, via a bus, to an auxiliary hardware device. As such, during emulation, the operation of the design under test and the auxiliary hardware device may be tested.

The method 501 further includes an operation 505 for allowing connection of an auxiliary hardware device to the emulator. An operation 507 for providing a voltage level detector connected between the emulator and the auxiliary hardware device. Lastly, the method 501 includes an operation 509 for detecting voltage levels on the bus, which fall outside a threshold value.

Illustrative Example of a Voltage Level Detector Application

Figure 6:
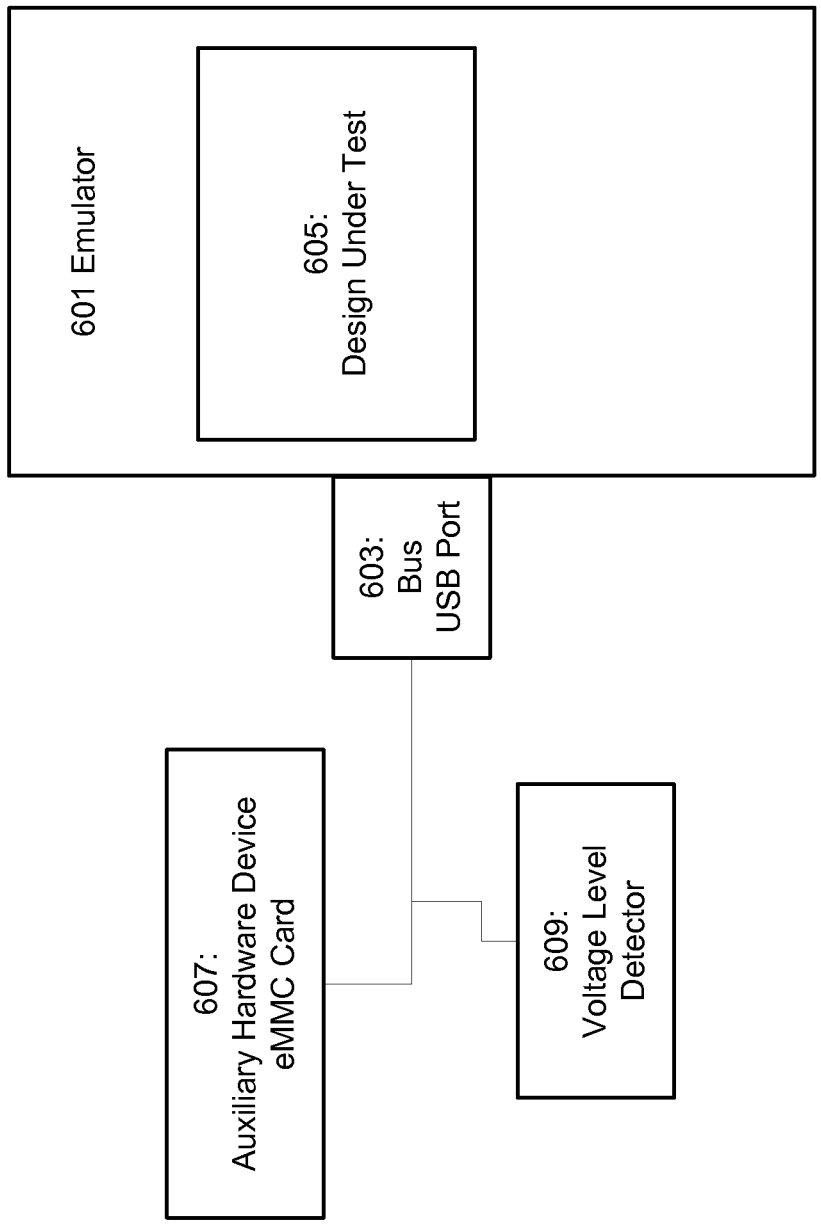
FIG. 6 illustrates an emulation environment that may be provided according to various implementations of the invention.

FIG. 6 shows an illustrative example of one possible implementations of the invention. As stated above, a number of different technologies may be used to implement an emulator as such, the particular technologies highlighted in this example are in no way intended to be limiting. As can be seen from this figure, an emulator 601 having a USB 603 is shown. As can be further seen, a design under test 605 has been loaded onto the emulator 601. The design under test included functionality to read and write onto the USB bus 603. Furthermore, an auxiliary hardware device 607, which as can be seen in an eMMC card reader is connected to the emulator 601. As those of ordinary skill in the art will appreciate, during emulation, the functionality of the design under test 605 will be "mimicked" by the emulator. As such, the emulator may seek to read or write to the eMMC card reader 607. As a result, the voltage levels on the bus 603 will fluctuate depending upon the actual operations that are being carried out between the emulator 601 and the eMMC card reader 607.

FIG. 6 also shows a voltage level detector 609, connected to the bus 603. In various implementations, the voltage level detector 609 is also connected to the emulator 601. As such, during emulation, if an improper voltage level is detected on the bus 603, then the voltage level detector 609 may alert the emulator to a potential conflict of hardware. With some implementations, the voltage level detector may be connected to the control workstation for the emulator. As such, during emulation, if an improper voltage level is detected on the bus, then the user may be alerted via the control workstation.

During emulation, the voltage level detector 609 may be configured to sample the bus 603 at specified time periods to determine the voltage level on the bus. Subsequently, if an improper voltage level is detected, the condition may be evidenced on the output of the voltage level detector 609. For example, if the bus 603 were operating on 3 volt levels and the acceptable threshold was 0.5 volts, then the voltage level detector 609 could be configured to detect whenever the voltage on the bus 603 was outside a first range of 0-0.5 volts or a second range of 2.5 to 3 volts.

The disclosed methods may detect improper voltage signal levels that could otherwise go undetected or would cause the user to spend a lot of time investigating. The disclosed methods can also help the system designer to detect modes of operation that could potentially harm equipment due to bus conflicts that may go unnoticed for days in the lab.

Signals on a bus would be sampled with a circuit as in FIG. 4. Fixed resistor values or perhaps electronically controlled resistors for 413 and 419 could tune the circuit to different thresholds. Basically this circuit would look to see that a voltage is within a proper range when it samples at the user sample clock. For instance if we are in LVTTL 3.3V system we may want this circuit to alert us if the signal is not at least 0-0.5V or 2.8V-3.3V. Anything between 0.5-2.8V would be considered improper.

The output of this circuit would be sampled at the specific user clock. There could be control within the user's graphical user interface (GUI) when this feature is enabled. Perhaps all available signals of a data pod would include this feature.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. An emulator apparatus comprising:
an emulator including a plurality of configurable logic blocks for emulating a design for an integrated circuit;
a signal line connecting the emulator to a hardware component;
a voltage level detector connected to the signal line, the voltage level detector configured to detect whether a voltage level of a signal transmitted on the signal line is within a first predetermined range or within a second predetermined range, the voltage level detector including an output indicating when a voltage level of a signal transmitted on the signal line is outside of the first predetermined range and outside of the second predetermined range, the voltage level detector comprising:
a first set of resistors;
a first operational amplifier including an inverting input connected to an output of the first set of resistors and a non-inverting input connected to the signal line;
a second set of resistors;
a second operational amplifier including a non-inverting input connected to an output of the second set of resistors and an inverting input connected to the signal line; and
an exclusive-or gate including a first input connected to an output of the first operational amplifier and a second input connected to an output of the second operational amplifier, the output of the exclusive-or gate being the output of the voltage level detector; and
a sampling circuit configured to sample the output of the voltage level detector at a user specified clock.

2. The apparatus of claim 1, further comprising a control workstation connected to the emulator, the control workstation configured to receive the sampled output of the voltage level detector and alert the user if the voltage level of the signal transmitted on the signal line is outside of the first predetermined range and outside of the second predetermined range.

3. The apparatus of claim 1, further comprising a control workstation connected to the emulator, the control workstation configured to receive the sampled output of the voltage level detector and pause an operation of the emulator if the voltage level of the signal transmitted on the signal line is outside of the first predetermined range and outside of the second predetermined range.

4. The apparatus of claim 1, wherein the voltage level detector includes an electronically controlled resistor.

5. The apparatus of claim 1, wherein the first set of resistors includes an electronically controlled resistor connected between power and the output of the first set of resistors.

6. The apparatus of claim 5, wherein the second set of resistors includes an electronically controlled resistor connected between ground and the output of the second set of resistors.

7. The apparatus of claim 1, wherein the voltage level detector includes a variable resistor.

8. A system comprising:
an emulator including a plurality of configurable logic blocks for emulating a design for an integrated circuit;
a signal line connecting the emulator to a hardware component;
a voltage level detector connected to the signal line, the voltage level detector configured to detect whether a voltage level of a signal transmitted on the signal line is within a first predetermined range or within a second predetermined range, the voltage level detector including an output indicating when a voltage level of a signal transmitted on the signal line is outside of the first predetermined range and outside of the second predetermined range, the voltage level detector comprising:
a first set of resistors;
a first operational amplifier including an inverting input connected to an output of the first set of resistors and a non-inverting input connected to the signal line;
a second set of resistors;
a second operational amplifier including a non-inverting input connected to an output of the second set of resistors and an inverting input connected to the signal line; and
an exclusive-or gate including a first input connected to an output of the first operational amplifier and a second input connected to an output of the second operational amplifier, the output of the exclusive-or gate being the output of the voltage level detector; and
a sampling circuit configured to sample the output of the voltage level detector at a user specified clock.

9. The system of claim 8, further comprising a control workstation connected to the emulator, the control workstation configured to receive the sampled output of the voltage level detector and provide an alert if the voltage level of the signal transmitted on the signal line is outside of the first predetermined range and outside of the second predetermined range.

10. The system of claim 8, further comprising a control workstation connected to the emulator, the control workstation configured to receive the sampled output of the voltage level detector and pause an operation of the emulator if the voltage level of the signal transmitted on the signal line is outside of the first predetermined range and outside of the second predetermined range.

11. The system of claim 8, wherein the voltage level detector includes an electronically controlled resistor.

12. The system of claim 8, wherein the first set of resistors includes an electronically controlled resistor connected between power and the output of the first set of resistors.

13. The system of claim 8, wherein the second set of resistors includes an electronically controlled resistor connected between ground and the output of the second set of resistors.

14. The system of claim 8, wherein the voltage level detector includes a variable resistor.

* * * * *